United States Patent [19]

Staats

[11] 3,936,766

[45] Feb. 3, 1976

[54] MAGNETRON WITH CAPACITIVELY COUPLED EXTERNAL CAVITY RESONATOR

[75] Inventor: James E. Staats, Louisville, Ky.

[73] Assignee: General Electric Company, Louisville, Ky.

[22] Filed: Mar. 5, 1975

[21] Appl. No.: 555,391

[52] U.S. Cl. ............ 331/88; 315/39.53; 315/39.61; 315/39.77; 331/90

[51] Int. Cl.² ...................... H01J 25/50; H03B 9/10

[58] Field of Search ................................ 331/86–91; 315/39.51, 39.53, 39.55, 39.57, 39.59, 39.61, 39.77; 313/156–159; 330/47; 328/253; 219/10.55 B

[56] References Cited

UNITED STATES PATENTS

| | | | |
|---|---|---|---|
| 2,517,731 | 8/1950 | Sproull | 315/39.53 X |
| 2,666,165 | 1/1954 | Hutchinson | 315/40 |
| 2,769,937 | 11/1956 | Hutchinson et al. | 315/39.77 |
| 3,334,267 | 8/1967 | Plumridge | 315/39.55 |
| 3,334,268 | 8/1967 | Downing | 315/39.65 |
| 3,456,151 | 7/1969 | Staats | 315/39.51 |
| 3,551,735 | 12/1970 | Staats | 315/39.77 |

*Primary Examiner*—Siegfried H. Grimm
*Attorney, Agent, or Firm*—Prangley, Dithmar, Vogel, Sandler & Stotland

[57] ABSTRACT

A magnetron adapted for operation with an ungrounded power supply, has mounted thereon and tightly coupled thereto an external cavity resonator having coaxial first and second openings in opposite walls thereof. The magnetron has coaxial output connection members including a hollow outer connection member communicating with the interior of the cavity resonator through the first opening, and an internal connection member extending entirely through and beyond the resonator via the first and second openings. The cavity resonator is galvanically insulated from the magnetron by teflon insulation which provides capacitive coupling therebetween. The cavity is coupled to a load which may be grounded. The cavity resonator is formed from a closed section of wave guide, two embodiments of which are disclosed.

13 Claims, 6 Drawing Figures

FIG. 3
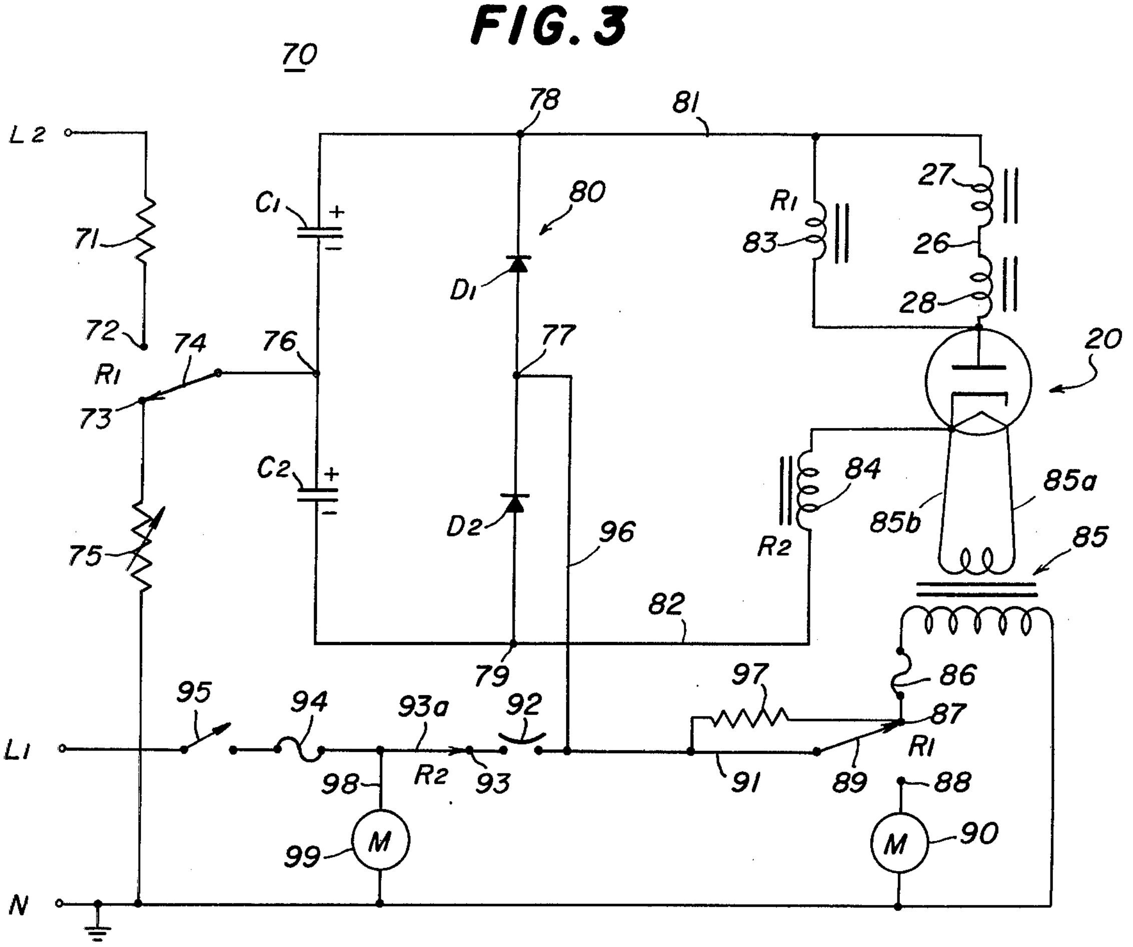
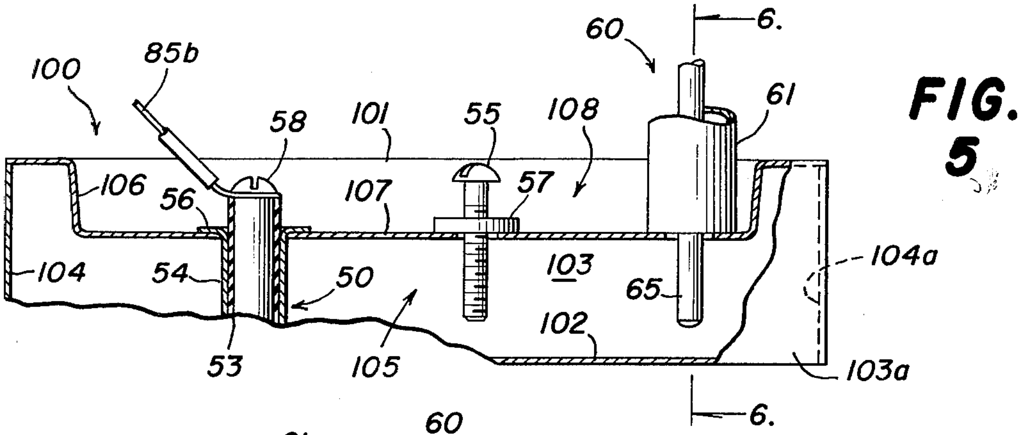
FIG. 5
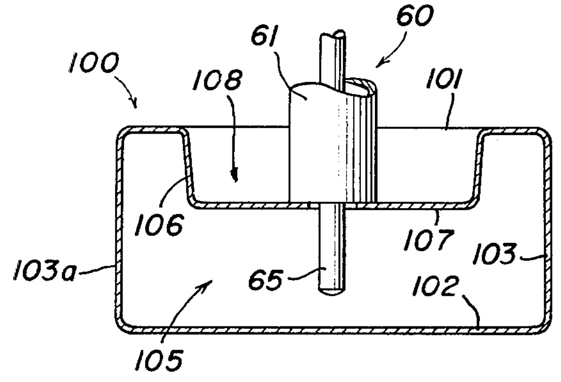
FIG. 6

MAGNETRON WITH CAPACITIVELY COUPLED EXTERNAL CAVITY RESONATOR

BACKGROUND OF THE INVENTION

This invention relates to a magnetron provided with an external cavity to stabilize the frequency of operation of the magnetron, and particularly to a magnetron of the low voltage type which is capable of operating with D.C. operating potentials of less than 700 volts. Many such low voltage magnetrons are designed for operation with a power supply of the voltage doubler and rectifier type, which cannot be grounded.

Examples of prior art magnetrons with external cavities for frequency stabilization are disclosed, for example, in the U.S. Pat. No. 3,334,268, issued to E. T. Downing on Aug. 1, 1967, U.S. Pat. No. 3,334,267, issued to R. F. Plumridge on Aug. 1, 1967, and U.S. Pat. No. 2,517,731, issued to R. L. Sproull on Aug. 8, 1950. In all of these prior art devices, however, the external cavity resonator is galvanically connected to the magnetron tube. When the magnetron is utilized in a consumer appliance, such as an electronic oven, the oven into which the microwave energy is transmitted from the magnetron must be grounded for safety reasons, because of the high voltages experienced in the magnetron tube.

Even in the more modern low voltage magnetron tubes, such as those disclosed in U.S. Pat. No. 3,458,755 issued to James E. Staats on July 29, 1969, and U.S. Pat. No. 3,559,094 issued to James E. Staats on Jan. 26, 1971, both of which patents are assigned to the assignee of the present invention, where the operating potentials applied to the magnetron are in the range of about 222 volts to 700 volts D.C., the oven cavity must still be grounded. But low voltage magnetrons such as those disclosed in the Staats patents are designed to operate from a power supply of the voltage doubler and rectifier type, which, by its nature, cannot be grounded. Accordingly, external resonant cavities of the types disclosed in the prior art, which are galvanically connected to the magnetron tube, are not suitable for use with an ungrounded power supply and a grounded load.

SUMMARY OF THe INVENTION

It is a general object of the present invention to provide a magnetron with an external frequency stabilizing resonant cavity, which magnetron can readily be used with an ungrounded power supply to feed a grounded load. More particularly, it is an object of this invention to provide a magnetron tube having an external resonant cavity which is galvanically insulated from the magnetron tube, while providing R.F. coupling therebetween.

It is also a general object of this invention to provide an external cavity magnetron of the type set forth, which provides improved efficiency, and wherein the load is coupled to the external resonant cavity.

An important object of this invention is to provide, in combination, a crossed-field electron discharge device for generating ultra-high frequency electromagnetic energy, a cavity resonator disposed externally of the discharge device for stabilizing the frequency of operation thereof, and capacitive coupling means galvanically insulating the cavity resonator from the discharge device while coupling microwave energy therebetween.

In connection with the foregoing object, it is another object of this invention to provide a combination of the type set forth, wherein the crossed-field electron discharge device is adapted to be operated with an ungrounded power supply, and which further includes grounded output means coupled to the cavity resonator for transmitting microwave energy therefrom to an associated load.

In connection with the foregoing object, still another object of this invention is to provide a combination of the type set forth, wherein the crossed-field electron discharge device is provided with coaxial output connection members capacitively coupled to the enclosure through apertures therein.

Further features of the invention pertain to the particular arrangement of the parts of the external cavity magnetron whereby the above-outlined and additional operating features thereof are attained.

The invention, both as to its organization and method of operation, together with further objects and advantages thereof, will best be understood by reference to the following specification, taken in connection with the accompanying drawings.

BRIEF DESCRIPTION OF THE DRAWINGS

FIG. 3 is a schematic electrical diagram of a power supply circuit for use with the magnetron illustrated in FIG. 1;

FIG. 5 is a reduced fragmentary view in partial vertical section, similar to FIG. 1, illustrating an alternative embodiment of the cavity resonator for use in the present invention; and FIG. 6 is a view in vertical section taken along the line 6—6 in FIG. 5.

DESCRIPTION OF THE PREFERRED EMBODIMENTS

Figure 1:
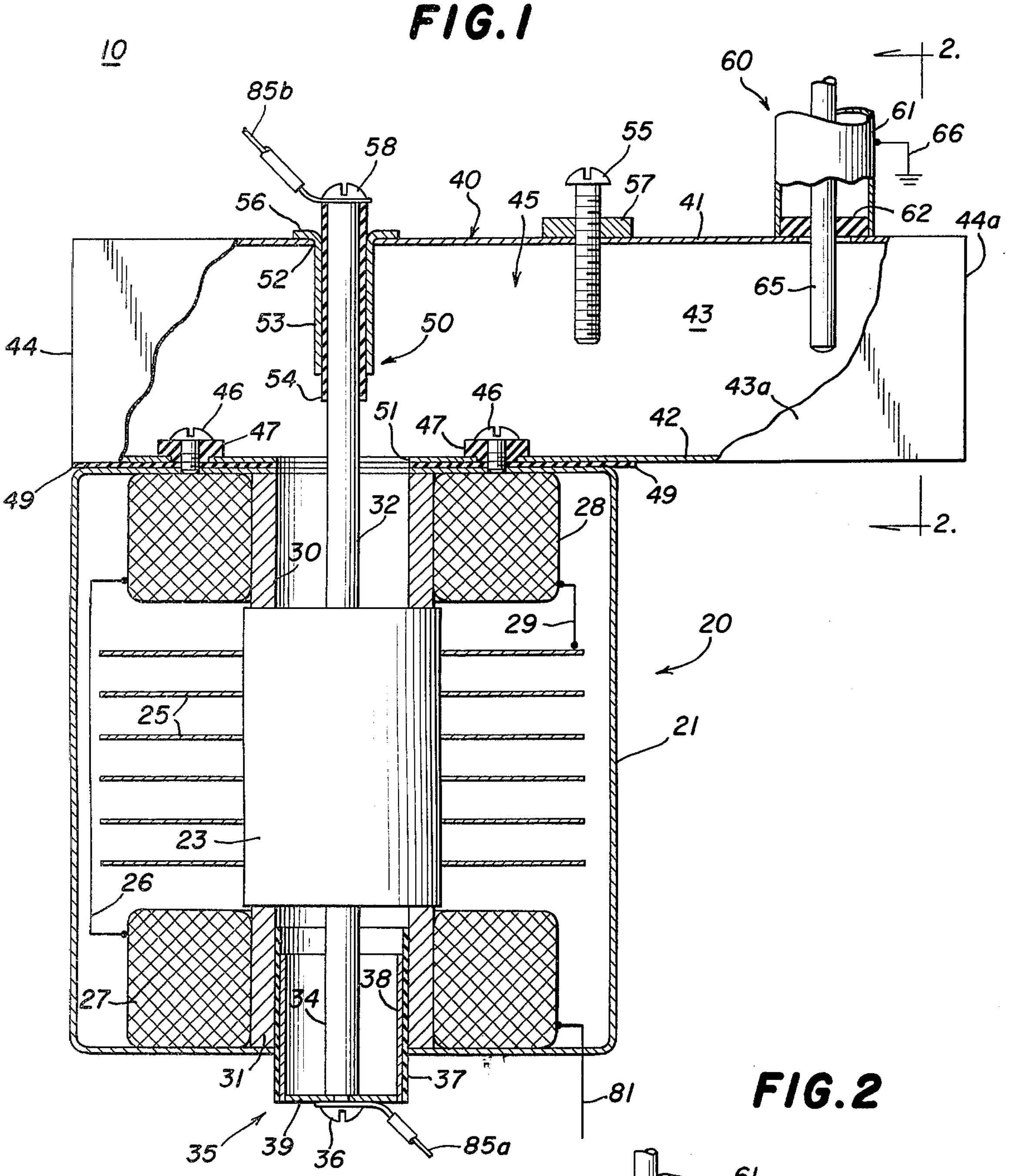
FIG. 1 is a view in partial seection of a magnetron with external resonant cavity, constructed in accordance with and embodying the features of the present invention.
Figure 2:
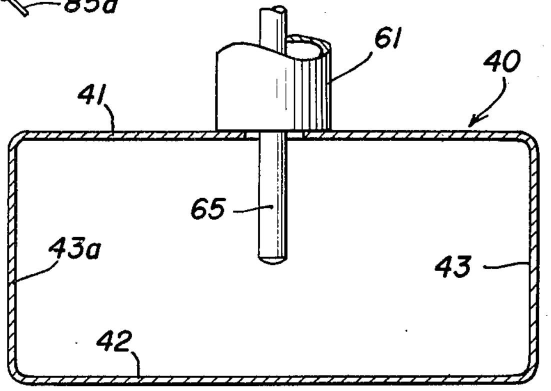
FIG. 2 is a view of the cavity resonator in vertical section taken along the line 2—2 in FIG. 1.

Referring now to FIGS. 1 and 2 of the drawings, there is illustrated a microwave generator, generally designated by the numeral 10, constructed in accordance with and embodying the features of the present invention. The microwave generator 10 includes a crossed-field electron discharge device, generally designated by the numeral 20, and generally of the construction and arrangement of the magnetron devices disclosed in the aforementioned U.S. Pat. No. 3,458,755 and in the U.S. Pat. No. 3,456,151, issued on July 15, 1969 to James E. Staats, and assigned to the assignee of the present invention. The device 20 is disposed within a box-like structure or casing 21 that extends completely about the device 20, but is open on two opposed sides thereof to accommodate the passage of air through the casing 21 to cool the device 20 and the associated parts of the microwave generator 10. The device 20 includes a substantially cylindrical metal envelope 23 and includes anode and cathode structure (not shown) within the envelope 23 as is more fully described in the aforementioned U.S. Pat. No. 3,456,151. Surrounding the envelope 23 and connected thereto is a plurality of cooling fins 25 for dissipating heat from the device 20.

In order to establish a unidirectional magnetic field within the device 20 there is provided a composite magnetic field winding 27 and 28 respectively disposed at the lower and upper ends of the device 20 and connected in series relation by a conductor 26. A D.C. operating potential from a power supply circuit, described below, is applied to the winding 27 and 28 by a conductor 81, and from the winding 28 to the device 20 by a conductor 29 which is connected to one of the cooling fins 25.

The crossed-field electron discharge 20 is provided with a hollow cylindrical magnet yoke 30 at the upper end thereof which is substantially coaxial with the envelope 23 and which connects to the anode of the device 20 (schematically shown in FIG. 3) and forms an outer conductor and an output terminal or connection member for the device 20, extending upwardly through the magnet winding 28. The lower end of the device 20 is likewise provided with a hollow cylindrical magnet yoke 31 having the upper end thereof connected to the anode of the device 20 and the other end extending downwardly through the field winding 27. The cathode and one terminal of the cathode heater of the device 20 (schematically shown in FIG. 3) have connected thereto a stud 32 forming a part of an upper coupling structure, generally designated by the numeral 50, the stud 32 and the magnet yoke 30 forming a coaxial output connection for the device 20. In like manner, the other terminal of the cathode heater has connected thereto a stud 34 which extends downwardly through the magnet yoke 31 coaxially therewith, forming a part of a lower coupling structure generally designated by the numeral 35.

The stud 34 is preferably tubular and receives a screw 36 in the lower end thereof serving as an input terminal for the cathode heater of the device 20. Disposed within and essentially lining the magnet yoke 31 is a cylindrical sleeve 37 of electrically insulating material, an inner cylindrical conductor 38 being disposed within and against the sleeve 37 coaxial therewith and telescopically overlapping a portion of the yoke 31. The outer end of the conductor 38 is closed by an end wall 39 having an opening therethrough for receiving the shank of the screw 36. The yoke 31, the stud 34, the insulating sleeve 37, the inner conductor 38 and the end wall 39 cooperate to form a parallel resonant circuit including a reactive impedance a capacitive impedance, the structure comprising a high impedance to R.F. energy to prevent propogation thereof to the terminal screw 36 and the associated power supply. More specifically, the distance between the lower adjacent end of the anode device 20 and the inner surface of the end wall 39 is equivalent to one-fourth wavelength at the operating frequency of the device 20, and the yoke 31 and the inner conductor 38 telescopically overlap a distance equivalent to one-eighth wavelength at the operating frequency of the device 20.

Mounted at the upper end of the device 20 is a cavity resonator, generally designated by the numeral 40, preferably formed from a closed section of rectangular wave guide, and constructed in accordance with a first embodiment of the present invention. The cavity resonator 40 includes a top wall 41, a bottom wall 42, a pair of opposed side walls 43 and 43*a*, and a pair of opposed end walls 44 and 44*a*, all cooperating to define a resonant cavity 45. The cavity resonator 40 is separated from the upper end of the casing 21 by a layer of dielectric insulating material 49. The cavity resonator 40 is fixedly secured to the casing 21 and the device 20 by mounting screws 46 which pass through bushings 47 formed of dielectric insulating material and inserted in complementary openings in the bottom wall 42 of the cavity resonator 40, the insulating layer 49 and the top wall of the casing 21, the screws 46 being threadedly engaged with the upper wall of the casing 21.

Formed in the bottom wall 42 of the cavity resonator 40 is a circular opening 51 substantially congruent with the open upper end of the magnet yoke 30 and a complementary opening in the dielectric insulating layer 49. Formed in the upper wall 41 of the cavity resonator 40 is a smaller circular opening 52 arranged substantially coaxially with the opening 51. Extending downwardly through the opening 52 coaxially therewith and into the resonant cavity 45 is a hollow cylindrical conductive sleeve 53, provided at the upper end thereof with an annular flange 56 which overlies the portion of the upper wall 41 immediately surrounding the opening 52 for supporting the sleeve 53. Disposed telescopically within the sleeve 53 coaxially therewith is a hollow sleeve 54 of dielectric insulating material, the sleeve 54 extending beyond the upper and lower ends of the sleeve 53. The cavity stud 32 of the device 20 extends upwardly through the opening 51 and telescopically through the insulating sleeve 54 to a point beyond the upper wall 41 of the cavity resonator 40, the stud 32 cooperating with the conductive sleeve 53 and the insulating sleeve 54 and the magnet yoke 30 to form the upper coupling structure 50 of the device 20. The upper end of the stud 32 receives therein a screw 58 which serves as an input terminal for the device 20.

The cavity resonator 40 is also provided with a tuning screw 55 threadedly engaged in a screw block 57 mounted on the upper wall 41 of the cavity resonator 40 and projecting downwardly through a complementary opening therein and into the resonant cavity 45 for effecting tuning of the resonant frequency thereof.

Disposed adjacent to the right-hand end of the cavity resonator 40, as viewed in FIG. 1, is a load coupling structure, generally designated by the numeral 60, and comprising a coaxial transmission line section including a hollow cylindrical outer conductor 61 connected to the upper wall 41 of the cavity resonator 40, and an inner conductor 65 disposed coaxially within the outer conductor 61 and spaced therefrom by a dielectric insulating spacer 62. The lower end of the inner conductor 65 passes through a complementary opening in the upper wall 41 of the cavity resonator 40 and projects downwardly into the resonant cavity 45 to form a coupling probe for coupling microwave energy from the resonant cavity 45 to the coupling structure 60. The other end of the coupling structure 60 is preferably coupled to an associated load (not shown) such as a microwave oven for transmitting microwave energy thereinto. Where the load is a consumer electronic device such as a microwave oven, it must be grounded for safety reasons, the ground connection being designated by the conductor 66 connected to the outer conductor 61 of the coupling structure 60 for grounding same.

In operation, the microwave energy is coupled from the internal cavities of the device 20 through the upper coupling structure 50 and into the resonant cavity 45 which is tuned to be resonant at the desired operating frequency of the device 20, which is normally in the range of either 915 MHz or 2450 MHz. The device 20 is tightly coupled to the external resonant cavity 45, which cavity, by reason of its high Q, stores more energy than the internal cavity of the magnetron device 20, thereby stabilizing the frequency of operation of the device 20 and resulting in improved circuit efficiency. It will be appreciated, that the operating frequency of the device 20 can be externally tuned by means of the tuning screw 55, which tunes the resonant cavity 45 and thereby the magnetron device 20.

It is an important feature of the present invention that the dielectric bushings 47, the dielectric layer 49 and the dielectric sleeve 54, all of which are preferably formed of a polytetrafluoroethylene resin such as that sold under the trademark "Teflon," cooperate to provide galvanic insulation of the cavity resonator 40 from the magnetron device 20 and the casing 21, while the dielectric sleeve 54 cooperates with the cavity stud 32 and the conductive sleeve 53 to provide capacitive coupling of the microwave energy between the magnetron device 20 and the resonant cavity 45. Thus, there is provided effective D.C. isolation of the cavity resonator 40 from the device 20 while affording R.F. coupling therebetween.

Referring now to FIG. 3 of the drawings, there is illustrated a power supply circuit, generally designated by the numeral 70, for use with the microwave generator 10 of the present invention. The power supply circuit 70 is adapted for use with a three-wire Edison network of 236 volts, single phase, 60 Hz A.C., and including two ungrounded line conductors $L_1$ and $L_2$ and a grounded neutral conductor N. The line conductor $L_2$ is connected to a resistor 71 which is in turn connected to one of the fixed contacts 72 of a relay $R_1$ which is also provided with a fixed contact 73 and a movable contact 74. The fixed contact 73 of the relay $R_1$ is connected to a thermistor 75, which is in turn connected to a neutral conductor N.

The movable contact 74 of the relay $R_1$ is connected to one input terminal 76 of a voltage doubler and rectifier network, generally designated by the numeral 80, the network 80 also having an input terminal 77 and a pair of output terminals 78 and 79. The voltage doubler and rectifier network 80 includes a capacitor $C_1$ connected between the input terminal 76 and the output terminal 78, a capacitor $C_2$ connected between the input terminal 76 and the output terminal 79, a semiconductor diode rectifier $D_1$ connected between the input conductor 77 and the output conductor 78 and a semiconductor diode rectifier $D_2$ connected between the input terminal 77 and the output terminal 79.

The output terminals 78 and 79 of the voltage doubler and rectifier circuit 80 are respectively connected to output conductors 81 and 82, the conductor 81 being connected to one terminal of a coil 83 of the relay $R_1$, the conductor 81 also being connected to the magnet winding 27 of the device 20. The other terminal of the relay coil 83 is connected to the anode of the device 20, as is the other terminal of the composite magnet winding 27, 28, as was described above. The output conductor 82 is connected to one terminal of a coil 84 of an overload relay $R_2$, the other terminal of which is connected to the cathode and one terminal of the cathode heater of the device 20.

Connected across the terminals of the cathode heater of the device 20 by conductors 85*a* and 85*b* is the secondary coil of a heater transformer 85, the primary coil of which has one terminal connected to the neutral conductor N and the other terminal connected to a fuse 86. The fuse 86 is in turn connected to the fixed contact 87 of another set of contacts of the relay $R_1$, which set also includes a fixed contact 88 and a movable contact 89. The fixed contact 88 of the relay $R_1$ is connected to one terminal of a timer motor 90, the other terminal of which is connected to the neutral conductor N. The movable contact 89 of the relay $R_1$ is connected through a conductor 91 in series with a thermal switch 92, a fixed contact 93 and a movable contact 93*a* of the relay $R_2$, a fuse 94, an ON-OFF switch 95 and the line conductor $L_1$.

The junction between the thermal switch 92 and the movable contact 89 of the relay $R_1$ is connected by a conductor 96 to the input terminal 77 of the voltage doubler and rectifier network 80. Connected in parallel with the movable contact 89 of the relay $R_1$ is a resistor 97, which preferably has a value of approximately 200 ohms. The junction between the movable contact 93*a* of the relay $R_2$ and the fuse 94 is connected by a conductor 98 to one terminal of a blower motor 99, the other terminal of which is connected to the neutral conductor N.

The power supply circuit 70 is a simplified version of the power supply illustrated in U.S. Pat. No. 3,445,784, issued to James E. Staats et al. on May 20, 1969, and assigned to the assignee of the present invention. In operation, the power supply circuit 70 is initially in the condition illustrated in FIG. 3, and when it is desired to energize the device 20, the ON-OFF switch 95 is closed, thereby energizing the blower motor 99 for cooling the apparatus, and applying approximately 118 volts A.C. to the primary coil of the heater transformer 85, thereby applying full power to the cathode heater of the device 20, it being appreciated that the resistor 97 is at this time shorted out by the movable contact 89 of the relay $R_1$.

The voltage doubler and rectifier network 80 is connected across the line conductors $L_1$ and N by the conductor 96 and the thermistor 75 and contacts 73 and 74 of the relay $R_1$. Approximately 118 volts A.C. is supplied to the thermistor 75, which is initially cold and therefore presents a high impedance in the circuit, whereby very little voltage is applied to the input terminals 76 and 77 of the voltage doubler and rectifier network 80 and, therefore, reduced D.C. voltage is applied across the anode and cathode of the device 20. As a consequence, there will not be sufficient anode to cathode potential in the device 20 to destroy the cathode by removing therefrom the emissive material prior to heating thereof to the proper operating temperature.

As the cathode is heated, more and more electrons are emitted from the cathode and the device 20 becomes conductive, and the current flows therethrough, and through the thermistor 75, the voltage doubler and rectifier circuit 80, and the relay coils 83 and 84. Since the thermistor 75 is in series with at least a portion of the current flowing through the circuit, the thermistor heats and the resistance thereof decreases. As the resistance of the thermistor 75 decreases, the proportion of the A.C. voltage across the line conductors $L_1$ and N appearing at the input terminals 76 and 77 of the voltage doubler and rectifier network 80 increases as the voltage dropped across the thermistor 75 decreases, and the D.C. voltage at the output terminals 78 and 79 of the voltage doubler and rectifier networks increases, until substantially all of the 118 volts across the line conductors $L_1$ and N are applied to the voltage doubler and rectifier network 80. As the D.C. voltage applied across the anode and cathode of the device 20 increases to a maximum of approximately 290 volts D.C., the current therethrough continues to rise to a predetermined value, at which value the relay $R_1$ is energized, thereby moving the movable contacts 74 and 89 from the positions illustrated in FIG. 3, respectively into contact with the fixed contacts 72 and 88.

The thermistor 75 is now removed from the input circuit to the voltage doubler and rectifier network 80 and the voltage applied thereto is controlled solely by the resistor 71. Also, the short across the resistor 97 is removed, whereby the voltage applied to the heater transformer 85 is now limited by the resistor 97 for providing a reduced current through the cathode heater. Furthermore, the timer motor 90 is now connected across the line conductors $L_1$ and N and thereby energized for operation of a timer, the functions of which are more fully described in the aforementioned U.S. Pat. No. 3,445,784. The device 20 is now in a run or operating condition, and will continue in that condition until the timer times out, for deenergizing the power supply 70 in a suitable manner, such as by opening the ON-OFF switch 95.

If the current through the device 20 exceeds a predetermined safe value, the overload relay $R_2$ will be energized, thereby opening the relay contacts 93 and 93*a*, and thereby deenergizing the timer motor 90, the heater transformer 85 and the voltage doubler and rectifier network 80 and shutting off power to the device 20. Similarly, if the temperature in the system exceeds a predetermined upper limit, the thermal switch 92 will open, thereby effecting the same results as opening of the relay contacts 93 and 93*a*. It will be appreciated that the power supply circuit may also be arranged to connect the input terminals of the voltage doubler and rectifier network 80 across the full 236 volts A.C. of the line conductors $L_1$ and $L_2$, thereby producing a maximum voltage of approximately 666 volts D.C. across the device 20.

It will be understood that since the power supply 70 includes a voltage doubler and rectifier network 80, which by its nature cannot have the output thereof grounded, care must be taken not to ground the microwave generator 10. This could present problems when the microwave generator 10 is to be used with a load which must be grounded, such as a consumer electronic device. Accordingly, it is an important feature of the present invention that the dielectric bushings 47, dielectric layer 49 and dielectric sleeve 54 cooperate to provide effective D.C. isolation of the device 20 from the cavity resonator 40, thereby providing an effective galvanic insulation between the output of the voltage doubler and rectifier network 80 and the grounded load, while not interfering with effective R.F. coupling of the microwave energy from the device 20 to the load through the cavity resonator 40. In this manner, the present invention permits the added efficiency of coupling the microwave energy output of the device 20 to the load directly through the external resonant cavity 45, while at the same time permitting use of the microwave generator 10 with a grounded load and an ungrounded power supply.

Figure 4:
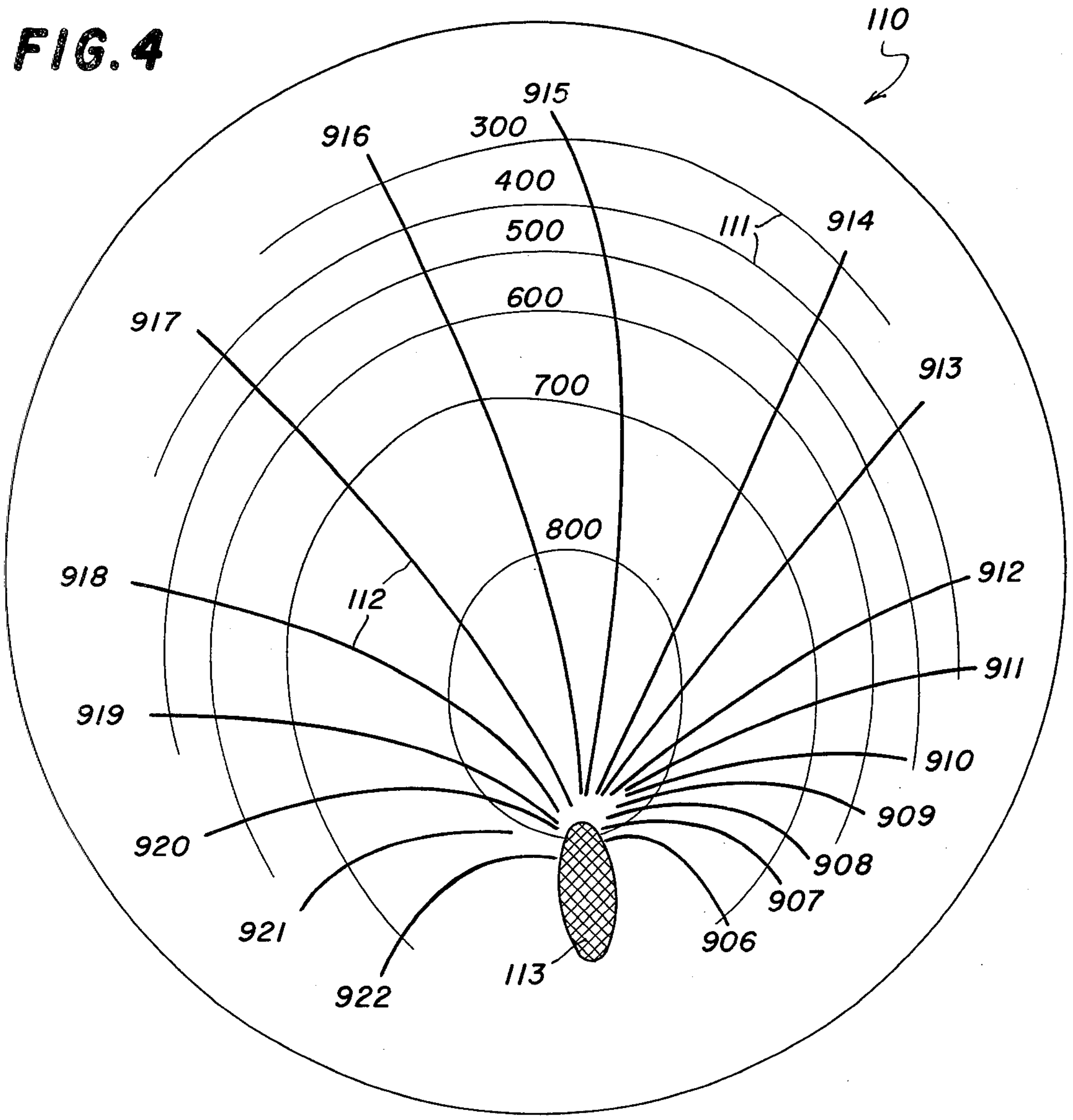
FIG. 4 is a graph plotting certain operating characteristics of the magnetron illustrated in FIG. 1.

In FIG. 4, there is diagrammatically illustrated a Rieke diagram superimposed on a Smith chart, for illustrating certain operating characteristics of the microwave generator 10 of the present invention. As illustrated in FIG. 4, a family of power curves 111 was attained, the members of the family of curves 111 for 300 watts, 400 watts, 500 watts, 600 watts, 700 watts and 800 watts having been illustrated. A family of curves 112 showing the frequency of operation and the frequency pulling has also been plotted in FIG. 4, as has the unstable region indicated by the numeral 113. In a constructional example of the microwave generator 10 of the present invention, it has been found that the invention produces significantly increased power and less heat loss than prior art devices under similar conditions.

Referring now to FIGS. 5 and 6 of the drawings, there is illustrated an alternative embodiment, generally designated 100, of the cavity resonator of the present invention. The cavity resonator 100 is generally similar to the cavity resonator 40, but instead of being formed of a rectangular wave guide section, it is formed from a section of ridge wave-guide. The cavity resonator 100 includes a top wall 101, a bottom wall 102, a pair of opposed side walls 103 and 103*a* and a pair of opposed end walls 104 and 104*a*. The top wall 101 has a recessed portion, including a peripheral shoulder 106 extending downwardly from a peripheral line disposed a slight distance inwardly from the end and side walls of the cavity resonator 100, the peripheral shoulder 106 being closed at the bottom end thereof by a wall portion 107 and cooperating therewith to define a recess 108 in the top wall 101 of the cavity resonator 100. The upper coupling structure 50, the tuning screw 55 and the load coupling structure 60 all cooperate with the upper wall portion 107 in the same manner as they cooperated with the top wall 41 of the cavity resonator 40 illustrated in FIG. 1.

In operation, the microwave energy is coupled between the magnetron device 20 and the resonant cavity 105, in essentially the same manner as the energy is coupled between the device 20 and the resonant cavity 45, as was described above with respect to FIG. 1. However, the cavity resonator 100 of FIGS. 5 and 6 permits the output coupling means to have smaller overall dimensions, i.e., the coupling structure 60 need not extend as far above the upper edge of the cavity resonator 100, whereby the vertical dimension of the system, as viewed in FIGS. 5 and 6 may be reduced, which may be a significant space saving in terms of fitting the microwave generator 10 into the housings or cabinetry of certain existing electronic devices such as microwave ovens.

From the foregoing, it can be seen that there has been provided a novel construction of a microwave generator, which provides stabilization of the operating frequency of the device, improved efficiency, and capability of use with grounded loads and ungrounded power supplies.

More particularly, there has been provided an improved magnetron generator which includes a crossed-field electron discharge device provided with an external frequency stabilizing cavity resonator, which is galvanically insulated from the magnetron device, while at the same time being tightly coupled thereto to provide capacitive coupling of microwave energy between the magnetron device and the cavity resonator.

There has also been provided a microwave generator of the character described, wherein the microwave energy is coupled from the magnetron device to a grounded load directly through the external cavity resonator, the insulation between the cavity resonator and the magnetron device permitting use of the generator with a power supply of the voltage doubler and rectifier type.

There have also been provided two embodiments of cavity resonators for use in the microwave generator of the present invention, both of which embodiments comprise closed sections of wave guide.

There has also been provided a magnetron generator of the character described, wherein the external resonant cavity can be externally tuned.

While there have been described what are at present considered to be the preferred embodiments of the invention, it will be understood that various modifications may be made therein, and it is intended to cover in the appended claims all such modifications as fall within the true spirit and scope of the invention.

What is claimed is:

1. In combination, a crossed-field electron discharge device for generating ultra-high frequency electromagnetic energy, a cavity resonator disposed externally of said discharge device for stabilizing the frequency of operation thereof, and capacitive coupling means galvanically insulating said cavity resonator from said discharge device while coupling microwave energy therebetween.

2. The combination set forth in claim 1, wherein said capacitive coupling means includes dielectric insulating means disposed between said discharge device and said cavity resonator.

3. The combination set forth in claim 1, wherein said cavity resonator includes tuning means for adjusting the resonant frequency of said cavity resonator.

4. The combination set forth in claim 1, wherein said cavity resonator is disposed adjacent to one end of said discharge device.

5. In combination, a crossed-field electron discharge device for generating ultra-high frequency electromagnetic wave energy and adapted to be operated with an ungrounded power supply, a cavity resonator disposed externally of said discharge device for stabilizing the frequency of operation thereof, capacitive coupling means galvanically insulating said cavity resonator from said discharge device while coupling microwave energy therebetween, and grounded output means coupled to said cavity resonator for transmitting microwave energy therefrom to an associated load.

6. The combination set forth in claim 5, wherein said discharge device is adapted to operate in response to a D.C. operating potential in the range of approximately 220 to 700 volts.

7. The combination set forth in claim 5, wherein said grounded output means includes a coaxial transmission line having a hollow outer conductor and a hollow inner conductor, said inner conductor extending into said cavity resonator and forming a coupling probe for coupling the microwave energy therein.

8. The combination set forth in claim 5, wherein said cavity resonator comprises an elongated box-like enclosure substantially rectangular in transverse cross-section and having an electrical width greater than one-half of the operating wavelength of said discharge device.

9. The combination set forth in claim 5, wherein said cavity resonator comprises an elongated generally box-like enclosure, said enclosure including one wall having a recessed portion therein, said output means being coupled to said cavity resonator at the recessed portion of said one wall. opening

10. In combination, a crossed-field electron discharge device for generating ultra-high frequency electromagnetic wave energy and adapted to be operated with an ungrounded power supply, said discharge device including a hollow cylindrical first output connection member adjacent to one end thereof and a second output connection member disposed within said first output connection member coaxially therewith, a conductive enclosure defining a resonant cavity therein and including two opposed walls respectively provided with coaxial circular openings therein with the opening in one of said walls having a diameter substantially equal to the diameter of said first output connection member, said enclosure being mounted adjacent to said one end of said discharge device with the openign in said one wall being disposed substantially in registry with the adjacent end of said first output connection member and with said second output connection member extending coaxially through both of said openings, capacitive coupling means galvanically insulating said enclosure from said discharge device while coupling microwave energy between said resonant cavity and said discharge device, and grounded output means coupled to said resonant cavity for transmitting microwave energy therefrom to an associated load.

11. The combination set forth in claim 10, and further including means fixedly securing said enclosure to said discharge device while maintaining galvanic insulation therebetween.

12. The combination set forth in claim 10, wherein said capacitive coupling means includes a generally cylindrical conductive sleeve extending into said resonant cavity from the opening in the other of said walls, said second output connection member extending through said sleeve coaxially therewith, and insulating means disposed between said second output connection member and said sleeve coaxially therewith for providing capacitive coupling between said discharge device and said resonant cavity while maintaining galvanic insulation therebetween.

13. The combination set forth in claim 10, wherein said capacitive coupling means includes a layer of dielectric material disposed between said enclosure and said discharge device and having an opening therethrough disposed substantially in registry with the adjacent end of said first output connection member, a generally cylindrical conductive sleeve extending into said resonant cavity from the opening in the other of said walls, said second output connection member extending through said sleeve coaxially therewith, and insulating means disposed between said second output connection member and said sleeve coaxially therewith for providing capacitive coupling between said discharge device and said resonant cavity while maintaining galvanic insulation therebetween.

* * * * *